US012761307B2

(12) United States Patent
Zhou et al.

(10) Patent No.: US 12,761,307 B2
(45) Date of Patent: Oct. 13, 2026

(54) METHODS AND SYSTEMS FOR GRADIENT SENSITIVITY CORRECTION

(71) Applicant: WUHAN UNITED IMAGING LIFE SCIENCE INSTRUMENT CO., LTD., Wuhan (CN)

(72) Inventors: Jianfan Zhou, Shanghai (CN); Bin Xing, Wuhan (CN); Hongxia Lei, Wuhan (CN); Renkuan Zhai, Wuhan (CN); Yao Xing, Shanghai (CN)

(73) Assignee: WUHAN UNITED IMAGING LIFE SCIENCE INSTRUMENT CO., LTD., Wuhan (CN)

( * ) Notice: Subject to any disclaimer, the term of this patent is extended or adjusted under 35 U.S.C. 154(b) by 163 days.

(21) Appl. No.: 18/743,038

(22) Filed: Jun. 13, 2024

(65) Prior Publication Data

US 2024/0426956 A1 Dec. 26, 2024

Related U.S. Application Data

(63) Continuation of application No. PCT/CN2022/100376, filed on Jun. 22, 2022.

(30) Foreign Application Priority Data

Dec. 14, 2021 (CN) ......................... 202111525705.1

(51) Int. Cl.
*G01V 3/00* (2006.01)
*G01R 33/56* (2006.01)
(Continued)

(52) U.S. Cl.
CPC ... *G01R 33/56572* (2013.01); *G01R 33/5608* (2013.01); *G01R 33/58* (2013.01)

(58) Field of Classification Search
CPC .............. G01R 33/287; G01R 33/4835; G01R 33/5608; A61B 2090/374
(Continued)

(56) References Cited

U.S. PATENT DOCUMENTS 5,545,995 A * 8/1996 Schneider ........ G01R 33/56563 324/318
2005/0024051 A1 2/2005 Doddrell et al.
(Continued)

FOREIGN PATENT DOCUMENTS

CN 101046506 A 10/2007
CN 103632367 A 3/2014
(Continued)

OTHER PUBLICATIONS

International Search Report in PCT/CN2022/100376 mailed on Sep. 7, 2022, 8 pages.
(Continued)

*Primary Examiner* — Walter L Lindsay, Jr.
*Assistant Examiner* — Frederick Wenderoth
(74) *Attorney, Agent, or Firm* — METIS IP LLC

(57) ABSTRACT

Embodiments of the present disclosure provide methods and systems for gradient sensitivity correction. The method may include obtaining a three-dimensional image of a phantom. The three-dimensional image may be acquired using an MRI device, and the phantom may have a known actual size on a target axis. The method may include determining a fitting
(Continued)

size of the phantom on the target axis by fitting the three-dimensional image. The method may further include correcting, based on the fitting size and the actual size, a gradient sensitivity of the MRI device.

20 Claims, 8 Drawing Sheets

(51) Int. Cl.
*G01R 33/565* (2006.01)
*G01R 33/58* (2006.01)

(58) Field of Classification Search
USPC .......................................................... 324/309
See application file for complete search history.

(56) References Cited

U.S. PATENT DOCUMENTS

| | | | |
|---|---|---|---|
| 2008/0231273 | A1 | 9/2008 | Kabasawa |
| 2009/0190817 | A1 | 7/2009 | Yanasak et al. |
| 2009/0284257 | A1 * | 11/2009 | Bammer .......... G01R 33/56509 324/307 |
| 2012/0201438 | A1 | 8/2012 | Vermandel et al. |
| 2014/0336968 | A1 | 11/2014 | Tu et al. |
| 2016/0310762 | A1 * | 10/2016 | Ramezanzadeh Moghadam ........ A61N 5/1075 |
| 2017/0059667 | A1 | 3/2017 | Bassoli et al. |
| 2017/0176546 | A1 | 6/2017 | Jain et al. |
| 2017/0367685 | A1 | 12/2017 | Zou et al. |
| 2018/0010923 | A1 | 1/2018 | Tu et al. |
| 2019/0250238 | A1 | 8/2019 | Leirens |
| 2020/0355765 | A1 | 11/2020 | Chen et al. |

FOREIGN PATENT DOCUMENTS

| | | | | |
|---|---|---|---|---|
| CN | 103761519 | A | | 4/2014 |
| CN | 204863189 | U | | 12/2015 |
| CN | 107024671 | A | | 8/2017 |
| CN | 108037318 | A | | 5/2018 |
| CN | 108195399 | A | | 6/2018 |
| CN | 108872909 | A | | 11/2018 |
| CN | 111060042 | A | | 4/2020 |
| CN | 112964278 | A | | 6/2021 |
| CN | 113782174 | A | | 12/2021 |
| CN | 114264997 | A | | 4/2022 |
| JP | 2009284958 | A | | 12/2009 |
| JP | 2019115546 | A | * | 7/2019 |
| WO | 2014025886 | A1 | | 2/2014 |

OTHER PUBLICATIONS

Written Opinion in PCT/CN2022/100376 mailed on Sep. 7, 2022, 8 pages.
Liu, Yifan et al., Calibration Method of Magnetic and Inertial Sensors Based on NewtonIteration and Ellipsoid Fitting, Chinese Journal of Scientific Instrument, 41(8): 142-149, 2020.
Hu, Fangzhou et al., An Improved Method for the Magnetometer Calibration Based on Ellipsoid Fitting, 2019 12th International Congress on Image and Signal Processing, BioMedical Engineering and Informatics (CISP-BMEI), 2020, 5 pages.

* cited by examiner

METHODS AND SYSTEMS FOR GRADIENT SENSITIVITY CORRECTION

CROSS-REFERENCE TO RELATED APPLICATIONS

This application is a continuation of International Application No. PCT/CN2022/100376, filed on Jun. 22, 2022, which claims the priority to Chinese Patent Application No. 202111525705.1, titled "METHODS AND DEVICES FOR GRADIENT SENSITIVITY CORRECTION AND MAGNETIC RESONANCE DEVICES," filed on Dec. 14, 2021, the entire contents of each of which are incorporated herein by reference.

TECHNICAL FIELD

The present disclosure relates to the field of magnetic resonance imaging (MRI), and in particular, to methods and systems for gradient sensitivity correction.

BACKGROUND

In a magnetic resonance system, a gradient sensitivity of an MRI device needs to be corrected to ensure that a size of a subject in an acquired magnetic resonance image is consistent with an actual size of the subject.

In conventional techniques, a spherical phantom is usually used for the gradient sensitivity correction. For example, the gradient sensitivity of the MRI device is corrected based on the consistency of dimensions of a center point of the spherical phantom at coronal, sagittal, and transverse planes. However, during an actual operation, accuracy requirements for positioning of the spherical phantom are high, which needs to make a center of the spherical phantom be consistent with a center of the MRI device as much as possible.

Therefore, the conventional techniques for the gradient sensitivity correction of the MRI device have problems, such as, low correction accuracy, complicated operation, etc.

SUMMARY

Some embodiments of the present disclosure provide a method for gradient sensitivity correction. The method may be implemented by at least one processor. The method may comprise obtaining a three-dimensional image of a phantom, the three-dimensional image being acquired using an MRI device, and the phantom having a known actual size on a target axis; determining a fitting size of the phantom on the target axis by fitting the three-dimensional image; and correcting, based on the fitting size and the actual size, a gradient sensitivity of the MRI device.

In some embodiments, the phantom may be a spherical phantom.

In some embodiments, the phantom may be a non-spherical phantom, and the non-spherical phantom may be positioned based on the target axis.

In some embodiments, the determining the fitting size of the phantom on the target axis by fitting the three-dimensional image may include determining, based on the three-dimensional image, at least one central section; and determining, based on the at least one central section, the fitting size of the phantom on the target axis.

In some embodiments, the correcting, based on the fitting and the actual size, the gradient sensitivity of the MRI device may include determining a difference between the fitting size and the actual size; determining whether the difference satisfies a preset condition; and in response to determining that the difference does not satisfy the preset condition, correcting the gradient sensitivity of the MRI device to obtain a corrected gradient sensitivity.

In some embodiments, the method may further include verifying the corrected gradient sensitivity.

In some embodiments, the verifying the corrected gradient sensitivity may include obtaining a three-dimensional verification image of the phantom, the three-dimensional verification image being acquired using the MRI device with the corrected gradient sensitivity; determining a verification fitting size of the phantom on the target axis by fitting the three-dimensional verification image; determining a verification difference between the verification fitting size and the actual size; and verifying, based on the verification difference, the corrected gradient sensitivity size.

In some embodiments, the MRI device may include a cantilever bed, and the phantom may be placed on the cantilever bed.

In some embodiments, the target axis may include three coordinate axes corresponding a coordinate system. The coordinate system may be established with a central position of a magnet imaging region of the MRI device as an origin, and with three spatially orthogonal axes as three axial directions, respectively.

Some embodiments of the present disclosure provide a system for gradient sensitivity correction. The system may comprise a storage device configured to store computer instructions; and a processor connected to the storage device and configured to, when the computer instructions are executed, direct the system to obtain a three-dimensional image of a phantom, the three-dimensional image being acquired using an MRI device, and the phantom having a known actual size on a target axis; determine a fitting size of the phantom on the target axis by fitting the three-dimensional image; and correct, based on the fitting size and the actual size, a gradient sensitivity of the MRI device.

Some embodiments of the present disclosure provide a non-transitory computer-readable storage medium storing computer instructions. When a computer reads the computer instructions, direct the computer to execute a method for gradient sensitivity correction. The method may include obtaining a three-dimensional image of a phantom, the three-dimensional image being acquired using an MRI device, and the phantom having a known actual size on a target axis; determining a fitting size of the phantom on the target axis by fitting the three-dimensional image; and correcting, based on the fitting size and the actual size, a gradient sensitivity of the MRI device.

Some embodiments of the present disclosure provide a system for gradient sensitivity correction. The system may comprise an obtaining module, a determination module, and a correction module. The obtaining module may be configured to obtain a three-dimensional image of a phantom. The three-dimensional image may be acquired using an MRI device, and the phantom may have a known actual size on a target axis. The determination module may be configured to determine a fitting size of the phantom on the target axis by fitting the three-dimensional image. The correction module may be configured to correct, based on the fitting size and the actual size, a gradient sensitivity of the MRI device.

BRIEF DESCRIPTION OF THE DRAWINGS

The present disclosure will be further illustrated by way of exemplary embodiments, which will be described in detail with reference to according to the drawings. These embodiments are not limiting, and in these embodiments the same numbering indicates the same structure, wherein.

DETAILED DESCRIPTION

Figure 1:
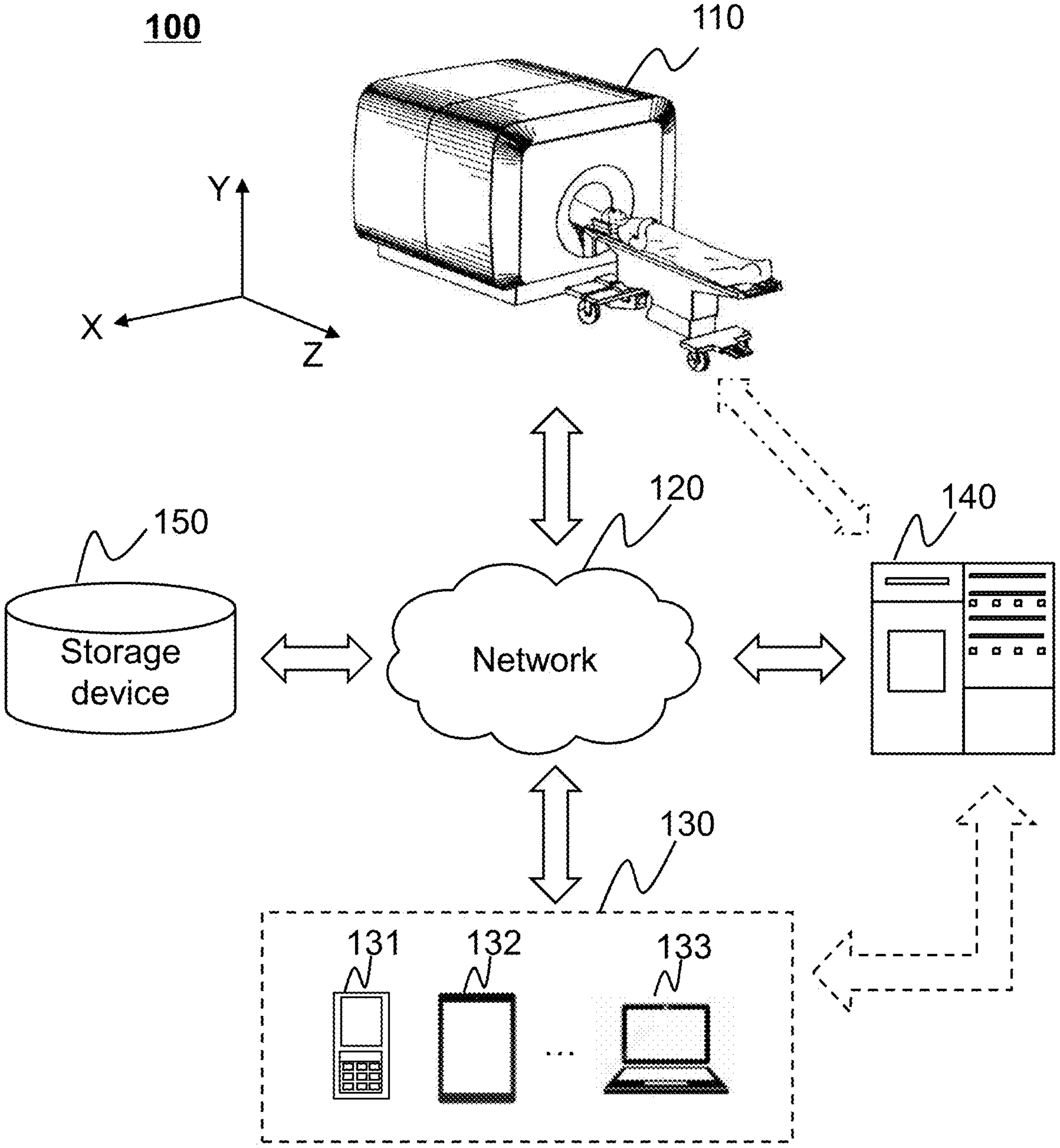
FIG. 1 is a schematic diagram illustrating an exemplary application scenario of an MRI system according to some embodiments of the present disclosure.

In order to more clearly illustrate the technical solutions of the embodiments of the present disclosure, the accompanying drawings required to be used in the description of the embodiments are briefly described below. Obviously, the accompanying drawings in the following description are only some examples or embodiments of the present disclosure, and it is possible for a person having ordinary skills in the art to apply the present disclosure to other similar scenarios in accordance with these drawings without creative labor. Unless obviously obtained from the context or the context illustrates otherwise, the same numeral in the drawings refers to the same structure or operation.

It should be understood that “system,” “device,” “unit,” and/or “module” as used herein is a method for distinguishing different components, elements, parts, portions or assemblies of different levels. However, the words may be replaced by other expressions if other words can achieve the same purpose.

As indicated in the disclosure and claims, the terms “a,” “an,” and/or “the” are not specific to the singular form and may include the plural form unless the context clearly indicates an exception. Generally speaking, the terms “comprising” and “including” only suggest the inclusion of clearly identified steps and elements, and these steps and elements do not constitute an exclusive list, and the method or device may also contain other steps or elements.

The flowchart is used in the present disclosure to illustrate the operations performed by the system according to the embodiments of the present disclosure. It should be understood that the preceding or following operations are not necessarily performed in the exact order. Instead, various steps may be processed in reverse order or simultaneously. Meanwhile, other operations may be added to these procedures, or a certain step or steps may be removed from these procedures.

The present disclosure provides a system for MRI and components thereof. In some embodiments, the system for MRI may include a single-modality imaging system and/or a multi-modality imaging system. The single-modality imaging system may include, for example, an MRI system. An exemplary MRI system may include a superconducting MRI system, a non-superconducting MRI system, or the like. The multi-modality imaging system may include, for example, a computed tomography-magnetic resonance imaging (MRI-CT) system, a positron emission tomography-magnetic resonance imaging (PET-MRI) system, a single-photon emission computed tomography-magnetic resonance imaging (SPECT-MRI) system, a digital subtraction angiography-magnetic resonance imaging (DSA-MRI) system, etc.

FIG. 1 is a schematic diagram illustrating an exemplary application scenario of an MRI system 100 according to some embodiments of the present disclosure.

As illustrated in FIG. 1, the MRI system 100 may include an MRI scanner 110, a network 120, one or more terminals 130, a processing device 140, and a storage device 150. Components of the MRI system 100 may be connected in one or more manners. Merely by way of example, the MRI scanner 110 may be connected to the processing device 140 via the network 120. As another example, the MRI scanner 110 may be directly connected to the processing device 140, as indicated by a dotted double-headed arrow connecting the MRI scanner 110 and the processing device 140. As yet another example, the storage device 150 may be connected to the processing device 140 directly or via the network 120. As still another example, the one or more terminals 130 may be connected to the processing device 140 directly (as indicated by a dotted double-headed arrow connecting the one or more terminals 130 and the processing device 140) or via the network 120.

In some embodiments, the MRI scanner 110 may be configured to scan a subject within a detection region of the MRI scanner 110 and generate data related to the subject (e.g., an echo signal or an MR signal associated with the subject). For example, the MRI scanner 110 may scan the subject by performing one or more protocols. In the present disclosure, “subject” and “object” may be used interchangeably. Merely by way of example, the subject may include a human body, an animal, an artificial subject (e.g., a phantom), etc. As another example, the subject may include a specific portion (e.g., an organ and/or a tissue) of the human body, the animal, or the phantom. For example, the subject may include a head, a brain, a neck, a body, shoulders, arms, a chest, a heart, a stomach, a blood vessel, a soft tissue, knees, feet, or the like, or any combination thereof.

In some embodiments, the MRI scanner 110 may include a closed-bore MRI scanner or an open-bore MRI scanner. In some embodiments, according to a type of a main magnet, the MRI scanner 110 may include a permanent magnet MR scanner, a superconducting electromagnet MR scanner, a resistive electromagnet MR scanner, etc. In some embodiments, according to an intensity of a magnetic field, the MRI scanner 110 may include a high-field MRI scanner, a mid-field MRI scanner, a low-field MRI scanner, etc. In some embodiments, according to a movement manner of a bed, the MRI scanner 110 may include a rail bed MRI scanner, a cantilever MRI scanner, etc. For example, the cantilever MRI scanner may include an animal MRI scanner, an infant MRI scanner, etc.

In the present disclosure, an X-axis, a Y-axis, and a Z-axis shown in FIG. 1 may form an orthogonal coordinate system. The X-axis and the Z-axis shown in FIG. 1 may be horizontal, and the Y-axis may be vertical. A positive X-direction along the X-axis shown in FIG. 1 refers to a direction from a right side to a left side of the MRI scanner 110 as seen from a direction facing the front of the MRI scanner 110. A positive Y-direction along the Y-axis shown in FIG. 1 refers to a direction from a lower portion to an upper portion of the MRI scanner 110. A positive Z-direction along the Z-axis shown in FIG. 1 refers to a direction in which the subject moves out of a scanning channel (also referred to as a bore) of the MRI scanner 110. In some embodiments, the MRI scanner 110 may include, for example, the main magnet, a gradient coil (also referred to as a spatial encoding coil), a radio frequency (RF) coil, etc.

The main magnet may generate a first magnetic field (also referred to as a main magnetic field) that can act on the subject (also referred to as the object) exposed to the main magnetic field. The main magnet may include an aperture for placing the subject. The main magnet may also control uniformity of the main magnetic field. For example, some shim coils may be placed in the main magnet. The shim coils placed in gaps of the main magnet may compensate for non-uniformity of the magnetic field of the main magnet.

The gradient coil may be placed in the main magnet. The gradient coil may generate a second magnetic field (also referred to as a gradient magnetic field, including gradient magnetic fields Gx, Gy, and Gz). The second magnetic field may be superimposed on the main magnetic field generated by the main magnet and distort the main magnetic field, so that magnetic orientations of protons of the subject may change according to positions of the protons of the subject within the gradient magnetic field, thereby encoding spatial information into the MR signal (e.g., the echo signal) generated by a region of the imaged subject. The gradient coil may include an X-coil (e.g., for generating the gradient magnetic field Gx corresponding to the X-direction), a Y-coil (e.g., for generating the gradient magnetic field Gy corresponding to the Y-direction), and/or a Z-coil (e.g., for generating the gradient magnetic field Gz corresponding to the Z-direction) (not shown in FIG. 1). In some embodiments, the Z-coil may be designed based on a circular (Maxwell) coil, and the X-coil and the Y-coil may be designed based on configurations of a saddle (Golay) coil. The three sets of coils (e.g., the X-coil, the Y-coil, and the Z-coil) may generate the three different magnetic fields for position encoding. The gradient coil may allow spatial encoding of the MR signal for image construction. In some cases, the three sets of coils of the gradient coil may be excited to generate the three gradient magnetic fields.

In some embodiments, the RF coil may be placed in the main magnet to serve as a transmitter, a receiver, or both. When used as the transmitter, the RF coil may generate an RF signal. The RF signal may provide a third magnetic field configured to generate the MR signal related to the region of the imaged subject. The third magnetic field may be perpendicular to the main magnetic field. When used as the receiver, the RF coil may be responsible for detecting the MR signal. After excitation, the MR signal generated by the subject may be sensed by the RF coil.

The network 120 may include any appropriate network facilitating exchange of information and/or data of the MRI system 100. In some embodiments, one or more components (e.g., the MRI scanner 110, the one or more terminals 130, the processing device 140, or the storage device 150) of the MRI system 100 may transmit the information and/or data with one or more other components of the MRI system 100 via the network 120. For example, the processing device 140 may obtain the data related to the subject from the MRI scanner 110 via the network 120. In some embodiments, the network 120 may be a wired network, a wireless network, or the like, or any combination thereof. The network 120 may be and/or include a public network (e.g., the Internet), a private network (e.g., a local area network (LAN), a wide area network (WAN), etc.), the wired network (e.g., an Ethernet), the wireless network (e.g., a 11 network, a Wi-Fi network, etc.), a cellular network (e.g., a Long Term Evolution (LTE) network), a frame relay network, a virtual private network ("VPN"), a satellite network, a telephone network, a router, a hub, a switch, a server computer, or the like, or any combination thereof. Merely by way of example, the network 120 may include a cable network, the wired network, a fiber optic network, a telecommunications network, an intranet, a wireless local area network (WLAN), a metropolitan area network (MAN), a public switched telephone network (PSTN), a Bluetooth network, ZigBee network, a Near Field Communication (NFC) network, or the like, or any combination thereof. In some embodiments, the network 120 may include one or more network access points. For example, the network 120 may include wired and/or wireless network access points, such as a base station and/or an Internet exchange point. The one or more components of the MRI system 100 may connect to the network 120 through the network access points to perform the data and/or information exchange.

The one or more terminals 130 may include a mobile device 131, a tablet 132, a laptop 133, or the like, or any combination thereof. In some embodiments, the mobile device 131 may include a smart home device, a wearable device, a smart mobile device, a virtual reality (VR) device, an augmented reality (AR) device, or the like, or any combination thereof. In some embodiments, the smart home device may include a smart lighting device, a smart appliance control device, a smart monitoring device, a smart TV, a smart camera, an intercom, or the like, or any combination thereof. In some embodiments, the wearable device may include a smart bracelet, smart shoes and socks, a pair of smart glasses, a smart helmet, a smart watch, smart clothing, a smart backpack, a smart accessory, or the like, or any combination thereof. In some embodiments, the smart mobile device may include a smartphone, a personal digital assistant (PDA), a gaming device, a navigation device, a point-of-sale (POS), or the like, or any combination thereof. In some embodiments, the VR device and/or the AR reality device may include a VR helmet, VR glasses, VR goggles, an AR helmet, a pair of AR glasses, AR goggles, or the like, or any combination thereof. For example, the VR device and/or the AR device may include Google Glass™, Oculus Rift™, Hololens™, Gear VR™, etc. In some embodiments, the one or more terminals 130 may remotely operate the MRI scanner 110 and/or the processing device 140. In some embodiments, the one or more terminals 130 may operate the MRI scanner 110 and/or the processing device 140 over a wireless connection. In some embodiments, the one or more terminals 130 may receive information and/or instructions input by a user and send the received information and/or instructions to the MRI scanner 110 or the processing device 140 via the network 120. In some embodiments, the one or more terminals 130 may receive the data and/or information from the processing device 140. In some embodiments, the one or more terminals 130 may be a portion of the processing device 140. In some embodiments, the one or more terminals 130 may be omitted.

The processing device 140 may process the data and/or information obtained from the MRI scanner 110, the one or more terminals 130, and/or the storage device 150. For example, the processing device 140 may obtain an actual size and a fitting size of the phantom, and correct a gradient sensitivity of the MRI scanner 110 based on the actual size and the fitting size. In some embodiments, the processing device 140 may be a single server or a server group. The server group may be centralized or distributed. In some embodiments, the processing device 140 may be local or remote. For example, the processing device 140 may access the information and/or data stored in the MRI scanner 110, the one or more terminals 130, and/or the storage device 150 or obtained by the MRI scanner 110, the one or more terminals 130, and/or the storage device 150 via the network 120. As another example, the processing device 140 may be directly connected to the MRI scanner 110 (as indicated by the dotted double-headed arrow connecting the processing device 140 and the MRI scanner 110 in FIG. 1), the one or more terminals 130 (as indicated by the dotted double-headed arrow connecting the processing device 140 and the one or more terminals 130 in FIG. 1), and/or the storage device 150 to access the stored or obtained information and/or data. In some embodiments, the processing device 140 may be implemented on a cloud platform. Merely by way of example, the cloud platform may include a private cloud, a public cloud, a hybrid cloud, a community cloud, a distributed cloud, an internal cloud, a multi-tier cloud, or the like, or any combination thereof. In some embodiments, the processing device 140 may be implemented on a computing device 200 including one or more components shown in FIG. 2 of the present disclosure. In some embodiments, the processing device 140 or a portion of the processing device 140 may be integrated into the MRI scanner 110.

The storage device 150 may store the data and/or the instructions. In some embodiments, the storage device 150 may store the data obtained from the MRI scanner 110, the one or more terminals 130, and/or the processing device 140. For example, the storage device 150 may store data, such as a three-dimensional image, the actual size, and the fitting size of the phantom. In some embodiments, the storage device 150 may store the data and/or the instructions that the processing device 140 can perform or be used to perform exemplary methods described in the present disclosure. For example, the storage device 150 may store an instruction for the processing device 140 to correct the gradient sensitivity. In some embodiments, the storage device 150 may include a mass storage device, a removable storage device, a volatile read-write memory, a read-only memory (ROM), or the like, or any combination thereof. Exemplary mass storage devices may include a magnetic disk, an optical disk, a solid-state drive, etc. Exemplary removable storage devices may include a flash driver, a floppy disk, the optical disk, a memory card, a compact disk, a magnetic tape, etc. Exemplary volatile read-write memory may include random access memory (RAM). Exemplary RAMs may include a dynamic RAM (DRAM), a double data rate synchronous dynamic RAM (DDRSDRAM), a static RAM (SRAM), a thyristor RAM (T-RAM), and a zero-capacitance RAM (Z-RAM). Exemplary ROMs may include a mask ROM (MROM), a programmable ROM (PROM), an erasable programmable ROM (PEROM), an electrically erasable programmable ROM (EEPROM), a compact disk ROM (CD-ROM), a digital universal disk ROM, etc. In some embodiments, the storage device 150 may be implemented on the cloud platform. Merely by way of example, the cloud platform may include a private cloud, a public cloud, a hybrid cloud, a community cloud, a distributed cloud, an internal cloud, a multi-tier cloud, or the like, or any combination thereof.

In some embodiments, the storage device 150 may be connected to the network 120 to communicate with the one or more components (e.g., the MRI scanner 110, the processing device 140, the one or more terminals 130, etc.) of the MRI system 100. The one or more components of the MRI system 100 may access the data or the instructions stored in the storage device 150 via the network 120. In some embodiments, the storage device 150 may be directly connected to or in communication with the one or more components (e.g., the MRI scanner 110, the processing device 140, the one or more terminals 130, etc.) of the MRI system 100. In some embodiments, the storage device 150 may be a portion of processing device 140.

It should be noted that the above description is merely provided for purposes of illustration, and is not intended to limit the scope of the present disclosure. For those having ordinary skills in the art, various changes and modifications can be made under the teaching of the contents of the present disclosure. The features, structures, methods, and other characteristics of the exemplary embodiments described in the present disclosure can be combined in various manners to obtain additional and/or alternative exemplary embodiments. For example, the MRI system 100 may also include one or more power supplies (not shown in FIG. 1) connected to the one or more components (e.g., the MRI scanner 110, the processing device 140, the one or more terminals 130, the storage device 150, etc.) of the MRI system 100.

In some embodiments, a computing device 200 is provided. A schematic diagram illustrating an internal structure of the computing device 200 may be shown in FIG. 2. The computing device 200 may include a processor, a storage device, a communication interface, a display screen, and an input device connected via a system bus. The processor of the computing device 200 may be configured to provide computing and control capabilities. For example, the processor of the computing device 200 may be configured to implement the method for gradient sensitivity correction described in some embodiments of the present disclosure. The storage device of the computing device 200 may include a non-volatile storage medium and an internal memory. The non-volatile storage medium may store an operating system and computer programs. The internal memory may provide an environment for operation of the operating system and the computer programs in the non-volatile storage medium. The communication interface of the computing device 200 may be configured to communicate with an external terminal in a wired or wireless manner. The wireless manner may be implemented through Wi-Fi, an operator network, NFC, or other techniques. When executed by the processor, the computer programs may direct the processor to implement the method for gradient sensitivity correction. The display screen of the computing device 200 may include a liquid crystal display or an electronic ink display. The input device of the computing device 200 may be a touch layer covered on the display screen, or may be a button, a trackball, or a touch pad disposed on a housing of the computing device 200, or may be an external keyboard, touch pad or mouse, etc.

Figure 2:
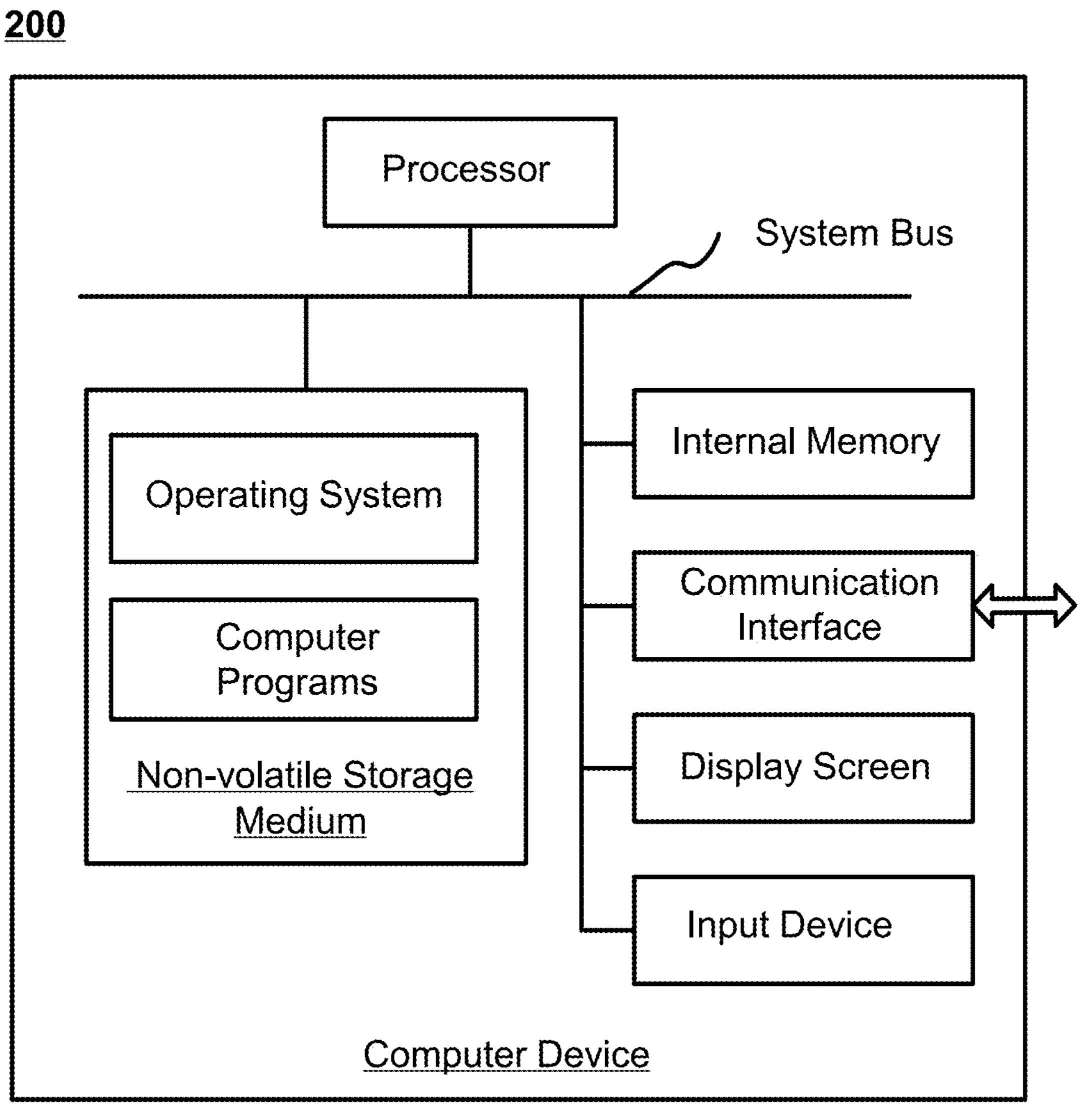
FIG. 2 is a schematic diagram illustrating an exemplary computing device according to some embodiments of the present disclosure.

Those skills in the art can understand that the structure shown in FIG. 2 is merely a block diagram illustrating a partial structure related to the solution of the present disclosure, and does not constitute a limitation on the computing device applied to the MRI system in the solution of the present disclosure. The specific computing device may include more or fewer components than those shown in FIG. 2, or be combined with certain components, or may have a different arrangement of components.

Figure 3:
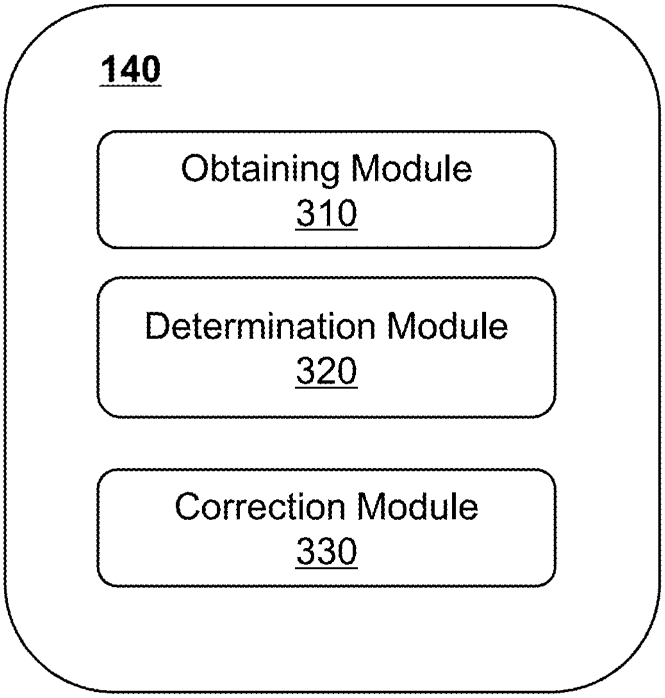
FIG. 3 is a block diagram illustrating an exemplary processing device according to some embodiments of the present disclosure.

FIG. 3 is a block diagram illustrating an exemplary processing device 140 according to some embodiments of the present disclosure. The processing device 140 may include an obtaining module 310, a determination module 320, and a correction module 330.

The obtaining module 310 may be configured to obtain a three-dimensional image of a phantom. The three-dimensional image may be acquired using an MRI device. The phantom may have a known actual size on a target axis. More descriptions regarding the obtaining the three-dimensional image may be found in operation 402 of FIG. 4, and relevant descriptions thereof.

The determination module 320 may be configured to determine a fitting size of the phantom on the target axis by fitting the three-dimensional image. The fitting size refers to a size of the phantom on the target axis determined based on a fitted three-dimensional image or a fitted three-dimensional model. More descriptions regarding the determination of the fitting size may be found in operation 404 of FIG. 4, and relevant descriptions thereof.

The correction module 330 may be configured to correct a gradient sensitivity of the MRI device based on the fitting size and the actual size. The gradient sensitivity may relate to a scale relationship between a subject to be scanned and an MR image of the subject to be scanned. More descriptions regarding the correction of the gradient sensitivity may be found in operation 406 of FIG. 4, and relevant descriptions thereof.

Modules of the system for gradient sensitivity correction may be implemented in whole or in part by software, hardware, or any combination thereof. Each of the above modules may be embedded in or independent of a processor of a computing device in the form of hardware, or may be stored in a storage device of the computing device in the form of software, so that the processor retrieves and executes operations corresponding to the above modules.

It should be noted that the above description of the system for gradient sensitivity correction and the modules thereof is merely for convenience of description and does not limit the present disclosure to the scope of the embodiments provided. It can be understood that for those skills in the art, after understanding the principle of the system, various modules may be arbitrarily combined or form subsystems connected to other modules without departing from these principles. For example, the obtaining module 310, the determination module 320, and the correction module 330 disclosed in FIG. 3 may be different modules in one system, or a single module may implement the functions of the two or more modules mentioned above. As another example, the modules of the system for gradient sensitivity correction may share a storage module, or each of the modules may have its own storage module. Such variations are within the scope of the present disclosure.

Figure 4:
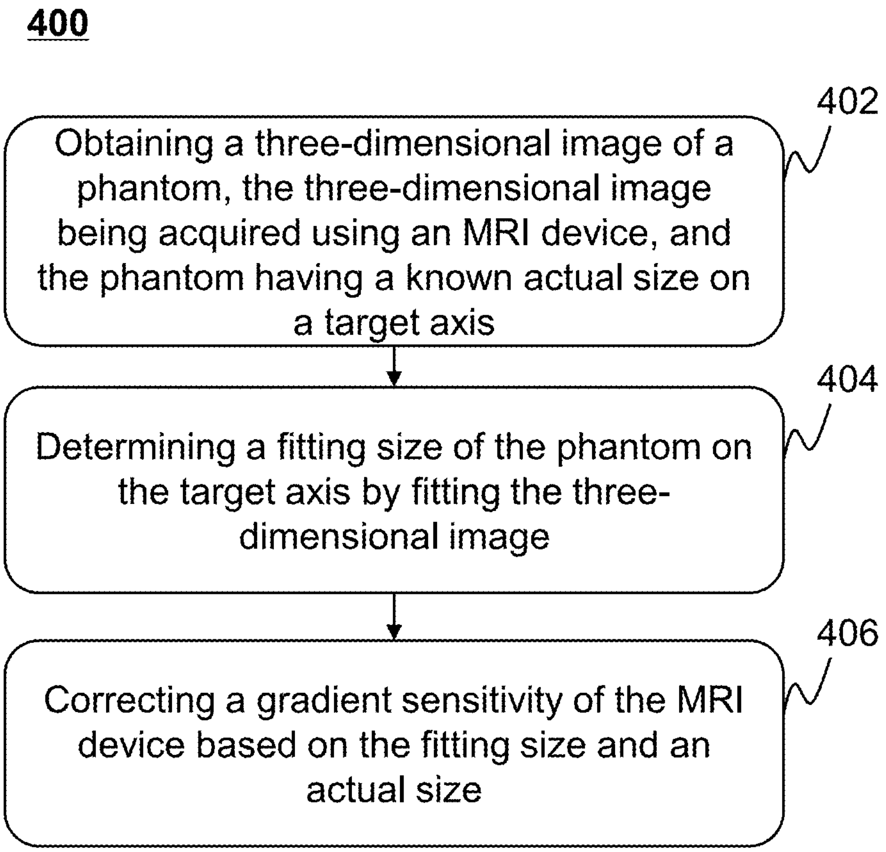
FIG. 4 is a flowchart illustrating an exemplary process for gradient sensitivity correction according to some embodiments of the present disclosure.

FIG. 4 is a flowchart illustrating an exemplary process 400 for gradient sensitivity correction according to some embodiments of the present disclosure. In some embodiments, the process 400 may be performed by the MRI system 100. For example, the process 400 may be stored in a storage device (e.g., the storage device 150) in the form of a set of instructions (e.g., application programs). In some embodiments, the processing device 140 (e.g., the one or more modules shown in FIG. 3) may execute the set of instructions and accordingly instruct one or more components of the MRI system 100 to perform the process 400.

In an MRI system, a gradient magnetic field refers to a magnetic field generated by a gradient coil of an MR scanner and having varying intensities in space. The gradient magnetic field (including gradient magnetic fields Gx, Gy and Gz) may be superimposed on a main magnetic field generated by a main magnet and distort the main magnetic field, so that magnetic orientations of protons of a subject to be scanned may change according to positions of the protons of the subject to be scanned within the gradient magnetic field, thereby encoding spatial information into an MR signal (e.g., an echo signal) generated by a region of the subject to be scanned. A gradient sensitivity represents a scale relationship between the subject to be scanned and an image (e.g., the MR image) acquired by performing MR scanning on the subject to be scanned. That is, a scale of the subject to be scanned in the MR image may be adjusted by adjusting the gradient sensitivity. If the gradient sensitivity is inaccurate, a size of the subject to be scanned in the MR image may be inconsistent with an actual size of the subject to be scanned, thereby reducing the accuracy of the MRI system. In order to ensure that the size of the subject in the acquired MR image is consistent with the actual size of the subject, the gradient sensitivity of the MRI device needs to be corrected. In the present disclosure, the size of the subject in the MR image refers to a size of the subject in an actual physical space determined based on the MR image. For example, the size of the subject in the actual physical space may be determined based on a pixel size of a portion of the image representing the subject and a correspondence relationship between the image and the actual physical space.

In conventional techniques, a spherical phantom is usually used for the gradient sensitivity correction. For example, the gradient sensitivity of the MRI device is corrected based on the consistency of dimensions of a center point of the spherical phantom at coronal, sagittal, and transverse planes. However, during an actual operation, accuracy requirements for positioning of the spherical phantom are high, which needs to make a center of the spherical phantom be consistent with a center of the MRI device as much as possible. Once the positioning of the phantom does not satisfy the accuracy requirements, the correction of the gradient sensitivity is inaccurate. In addition, in a cantilever MRI system (e.g., an animal MRI system, an infant MRI system, etc.), an inner diameter of a scanning chamber is relatively small, and a length of the scanning chamber is relatively long. The subject to be scanned is transported into a center of a magnet imaging region of the scanning chamber generally using a retractable cantilever bed fixed outside the scanning chamber. Compared with a rail bed MRI system commonly used in clinical practice, a cantilever end of the cantilever MRI system droops, making it difficult to determine the center of the phantom. Therefore, a lot of time and energy are required to accurately position the phantom when using the conventional techniques for gradient sensitivity correction, which reduces the usage efficiency of the MRI system and the user experience. Therefore, it is desirable to provide an effective system and method for gradient sensitivity correction. In some embodiments, the gradient sensitivity may be corrected by performing following operations of the process 400.

In 402, the processing device 140 (e.g., the obtaining module 310) may obtain a three-dimensional image of a phantom. The three-dimensional images may be acquired using an MRI device. The phantom may have a known actual size on a target axis.

The phantom may be used to test the MRI system. For example, the phantom may be used to test image performance of the MRI system. In some embodiments, the test of the MRI system may include measurements of a gradient sensitivity, a spatial uniformity, a scanning slice thickness/interslice spacing, a verification of a collimation positioning system, a spatial resolution, a geometric distortion rate (spatial linearity), a signal-to-noise ratio (SNR), a low contrast sensitivity (low contrast resolution), T1 and T2 relaxation time values, or the like, or any combination thereof.

In some embodiments, the phantom may be composed of any material capable of generating an MR signal under a magnetic field. For example, the phantom may be made of a single material. As another example, the phantom may be made of a plurality of materials. Merely by way of example, the phantom may include a glass housing and liquid (e.g., water, a saline solution, etc.).

In some embodiments, the phantom may have a fixed shape. For example, the phantom may have a regular shape (e.g., a sphere, a cylinder, a cuboid, a cube, etc.) or an irregular shape. Therefore, the processing device 140 may obtain the actual size of the phantom on the target axis based on the shape of the phantom. In some embodiments, the target axis may include three coordinate axes corresponding a coordinate system, and the coordinate system may be established with a central position (e.g., an isocenter point) of a magnet imaging region of the MRI system as an origin, and with three spatially orthogonal axes as three axial directions, respectively. For example, the target axis may include the X-axis, the Y-axis, and the Z-axis of the coordinate system shown in FIG. 1.

In some embodiments, the phantom may be a spherical phantom. Since a distance from a center of a sphere model to each point on a spherical plane of the sphere model is equal to a radius of the sphere model, the processing device 140 may determine the actual size of the spherical phantom on the target axis based on a radius of the spherical phantom. Moreover, the spherical phantom may be placed at any position of the magnet imaging region without placing a center of the spherical phantom at the central position of the magnet imaging region.

Figure 8:
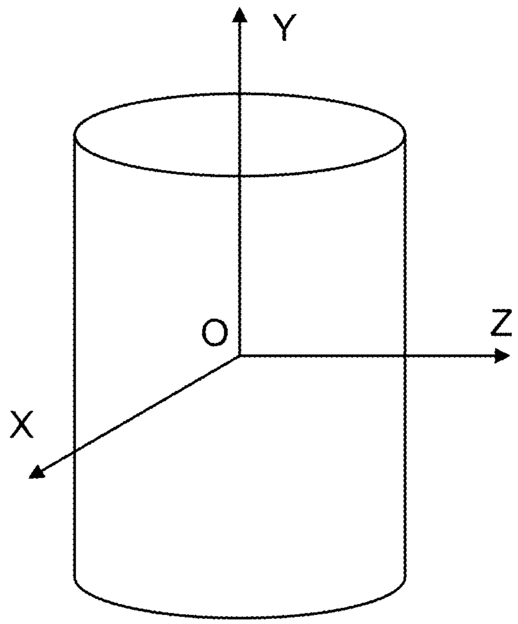
FIG. 8 is a schematic diagram illustrating an exemplary cylindrical phantom according to some embodiments of the present disclosure.

When the phantom is a non-spherical phantom (e.g., a cylindrical phantom, a cuboid phantom, a cube phantom, etc.), the phantom may be positioned first and then the actual size of the phantom on the target axis may be determined. Merely by way of example, as illustrated in FIG. 8, the phantom may be the cylindrical phantom, and a central point of the cylindrical phantom may coincide with the central position (i.e., a point O) of the magnet imaging region of the MRI system (e.g., the MRI scanner 110), so that a vertical direction of the cylindrical phantom is parallel to the Z-axis of the MRI system, and a horizontal section of the cylindrical phantom is parallel to the an XZ-plane of the MRI system, thereby completing the positioning of the cylindrical phantom. Accordingly, the processing device 140 may determine an actual size of the cylindrical phantom on the target axis. For instance, the processing device 140 may determine a diameter of a bottom surface of the cylindrical phantom as the actual size of the cylindrical phantom on the X-axis and the Z-axis, and determine a height size of the cylindrical phantom as the actual size of the cylindrical phantom on the Y-axis. In some embodiments, a user (e.g., a doctor, a technician, etc.) may confirm or check the positioning of the non-spherical phantom. In some embodiments, marker(s) may be preset on a scanning bed, and the marker(s) may be used to determine whether the positioning of the phantom is accurate. For example, the processing device 140 may determine whether the positioning of the phantom is accurate based on a positional relationship (e.g., parallel, coincident) between the phantom and the marker(s).

The three-dimensional image of the phantom may indicate three-dimensional stereoscopic information (e.g., three-dimensional structural features) of the phantom. In some embodiments, the three-dimensional image refers to an MR image acquired using the MRI device (e.g., the MRI scanner 110). For example, the processing device 140 may obtain MRI data of the phantom through the MRI device, and reconstruct a three-dimensional MR image based on the MRI data. Alternatively, the processing device 140 may reconstruct two-dimensional MR images based on the MRI data. The processing device 140 may further obtain the three-dimensional image of the phantom by performing three-dimensional reconstruction on the two-dimensional MR images.

Merely by way of example, the three-dimensional image of the spherical phantom may be obtained by scanning the spherical phantom based on a multi-slice scanning protocol. For instance, the multi-slice scanning protocol may allow the MRI device to perform multi-slice scanning on the spherical phantom to obtain the three-dimensional image of the spherical phantom from multiple slices, which ensures the accuracy of the obtained three-dimensional image of the spherical phantom. It should be noted that the three-dimensional image of the spherical phantom in this embodiment is a reconstructed image, and the reconstructed image indicates the three-dimensional stereoscopic information of the spherical phantom. By accurately scanning the phantom based on the multi-slice scanning protocol, the three-dimensional image of the phantom obtained by scanning the phantom from the multiple slices may be obtained, which improves the accuracy of the three-dimensional image, thereby improving the accuracy of the gradient sensitivity correction.

In some embodiments, the phantom may be scanned using a pulse sequence (e.g., a conventional spin echo sequence, a fast spin echo sequence, etc.) insensitive to the uniformity of the magnetic field, thereby reducing the effect of the non-uniformity of the magnetic field on MR imaging.

In some embodiments, the processing device 140 may obtain the three-dimensional image of the phantom directly from the MRI device (e.g., the MRI scanner 110). Alternatively, the processing device 140 may obtain the three-dimensional image of the phantom from a storage device (e.g., the storage device 150) that stores the three-dimensional image of the phantom. In this embodiment, the time and operation for obtaining the three-dimensional image of the phantom are not limited, as long as the three-dimensional image of the phantom can be obtained by performing MR imaging on the phantom.

In some embodiments, the processing device 140 may perform preprocessing operations (e.g., size adjustment, image resampling, image normalization, etc.) after obtaining the three-dimensional image of the phantom. The processing device 140 may further perform other operations in the process 400 on a preprocessed three-dimensional image. For purposes of illustration, an original three-dimensional image is taken as an example to describe the implementation of the process 400 as follows.

In 404, the processing device 140 (e.g. the determination module 320) may determine a fitting size of the phantom on the target axis by fitting the three-dimensional image.

The fitting size refers to a size of the phantom on the target axis determined based on a fitted three-dimensional image or a fitted three-dimensional model.

In some embodiments, the processing device 140 may obtain the fitted three-dimensional image or the fitted three-dimensional model by fitting the three-dimensional image of the phantom using a preset fitting algorithm. For example, the processing device 140 may reconstruct the phantom based on the three-dimensional image. Further, the processing device 140 may determine the fitting size of the phantom on the target axis based on the fitted three-dimensional image or the fitted three-dimensional model. It can be understood that coordinates of each point in a coordinate system established with the central position of the magnet imaging region of the MRI device as an origin, and with three spatially orthogonal axes as three axial directions, respectively, may be obtained. That is, the processing device 140 may determine the fitting size of the phantom on the target axis based on a fitted image.

Taking the phantom being the spherical phantom as an example, the processing device 140 may fit the three-dimensional image of the spherical phantom (e.g., ellipsoid fitting) using a preset fitting algorithm. That is, the processing device 140 may fit a sphere (e.g., an ellipsoid or a standard sphere) based on the three-dimensional image of the spherical phantom, so as to obtain the fitting size of the sphere on the target axis based on the fitted sphere. For example, if an ellipsoid is fitted based on the three-dimensional image of the spherical phantom, the processing device 140 may obtain a fitting size of a longest axis of the ellipsoid, a fitting size of a shortest axis of the ellipsoid, and a fitting size of an axis perpendicular to the longest axis and the shortest axis simultaneously based on the coordinates of each point in the coordinate system. As another example, if a standard sphere is fitted based on the three-dimensional image of the spherical phantom, the processing device 140 may obtain a fitting size of the standard sphere on the target axis through the coordinates of each point in the coordinate system.

In some embodiments, the processing device 140 may determine at least one central section based on the three-dimensional image. The central section refers to a section that passes through a center of the phantom in the three-dimensional image, such as a first section parallel to an XY-plane and passing through the center of the phantom, a second section parallel to the XZ-plane and passing through the center of the phantom, and a third section parallel to a YZ-plane and passing through the center of the phantom. Further, the processing device 140 may determine the fitting size of the phantom on the target axis based on the at least one central section. For example, the processing device 140 may obtain the fitting sizes of the phantom on the X-axis and the Y-axis based on the first section. The processing device 140 may obtain the fitting sizes of the phantom on the X-axis and the Z-axis based on the second section. The processing device 140 may obtain the fitting sizes of the phantom on the Y-axis and the Z-axis based on the third section. In some embodiments, the processing device 140 may assign a weight to each fitting size, and determine the fitting size of the phantom on the target axis in a weighted manner. For example, the processing devices 140 may assign weights (e.g., a weight 1 and a weight 2) to the fitting size of the phantom on the Y-axis determined based on the first section and the fitting size of the phantom on the Y-axis determined based on the third section, respectively, and determine the fitting size of the phantom on the Y-axis in the weighted manner. The weight 1 and weight 2 may be the same or different.

In 406, the processing device 140 (e.g., the correction module 330) may correct the gradient sensitivity of the MRI device based on the fitting size and the actual size.

The gradient sensitivity may represent a scale relationship between the subject to be scanned and the MR image of the subject to be scanned. The gradient sensitivity may be accurate when a size of the subject (e.g., the phantom) in the acquired MR image is consistent with the actual size of the subject. The gradient sensitivity may be inaccurate when the size of the subject in the acquired MR image is inconsistent with the actual size of the subject. For example, when the spherical phantom appears as an ellipsoid in the acquired MR image, or when the fitting size of the phantom on the target axis is inconsistent with the actual size of the phantom on the target axis, the gradient sensitivity may be inaccurate.

In some embodiments, the processing device 140 may obtain a similarity degree between the fitting size and the actual size, and correct the gradient sensitivity of the MRI device based on the similarity degree. The similarity degree refers to a closeness degree between a value of the fitting size and a value of the actual size. For example, if a similarity degree between the fitting size and the actual size is relatively large (e.g., the similarity degree between the fitting size of the phantom on each target axis and the actual size of the subject on the corresponding axis is relatively large), it means that the fitting size is similar to the actual size, and the processing device 140 may make subtle adjustment to the gradient sensitivity of the MRI device or maintain a current gradient sensitivity of the MRI device. If the similarity degree between the fitting size and the actual size is relatively small (e.g., the similarity degree between the fitting size and the actual size of the phantom on the target axis is relatively small), it means that a difference between the fitting size and the actual size is relatively large, and the processing device 140 may make large adjustment to the gradient sensitivity of the MRI device until the fitting size is similar to the actual size. It can be understood that, under ideal circumstances, the fitted size of the phantom on the target axis is the actual size of the phantom on the target axis. That is, under the ideal circumstances, the fitting size is equal to the actual size.

In some embodiments, the processing device 140 may determine the difference between the fitting size and the actual size. The processing device 140 may determine whether the difference between the fitting size and the actual size satisfies a preset condition. If the difference between the fitting size and the actual size does not satisfy the preset condition, the processing device 140 may correct the gradient sensitivity of the MRI device. If the difference between the fitting size and the actual size satisfies the preset condition, the processing device 140 may not correct the gradient sensitivity of the MRI device. That is, the processing device 140 may perform the MR imaging on the subject without correcting the gradient sensitivity of the MRI device. More descriptions regarding the correction of the gradient sensitivity may be found in FIG. 5 and relevant descriptions thereof.

In some embodiments, the processing device 140 may verify a corrected gradient sensitivity. For example, the processing device 140 may determine a verification fitting size of the phantom on the target axis based on a three-dimensional verification image of the phantom acquired by the MRI device with the corrected gradient sensitivity, and verify the corrected gradient sensitivity based on a verification difference between the verification fitting size and the actual size. More descriptions regarding the verification of the gradient sensitivity may be found in FIG. 6 and relevant descriptions thereof.

According to some embodiments of the present disclosure, the gradient sensitivity of the MRI device may be corrected based on the fitting size and the actual size, thereby improving the accuracy of the gradient sensitivity correction. The three-dimensional image of the spherical phantom may be obtained, and the fitting size of the spherical phantom on the target axis may be determined based on the three-dimensional image of the spherical phantom. Due to physical properties of the sphere, the spherical phantom can be placed at any position of the magnet imaging region of the MRI system. That is, the center of the spherical phantom does not need to coincide with the central position of the magnet imaging region. To this end, the requirements for the positioning of the phantom during the gradient sensitivity correction can be reduced, and the accuracy and efficiency of the gradient sensitivity correction can be improved. In addition, since the requirements for the positioning of the phantom during the gradient sensitivity correction are reduced, the method for gradient sensitivity correction according to some embodiments of the present disclosure can be applied to any MRI system, especially an MRI system (e.g., the cantilever MRI system, the animal MRI system, the infant MRI systems, etc.) with a small scanning chamber and difficulty in positioning the phantom.

It should be noted that the above description of the process 400 is merely provided for purposes of illustration, and is not intended to limit the scope of the present disclosure. For those skills in the art, various variations and modifications can be made under the guidance of the present disclosure. However, such variations and modifications do not depart from the scope of the present disclosure. In some embodiments, the process 400 may be completed by one or more additional operations not described and/or by omitting one or more operations discussed above. For example, after the gradient sensitivity is verified, the processing device 140 may store the corrected gradient sensitivity in the storage device (e.g., the storage device 150) for subsequent use in the MRI scanning.

Figure 5:
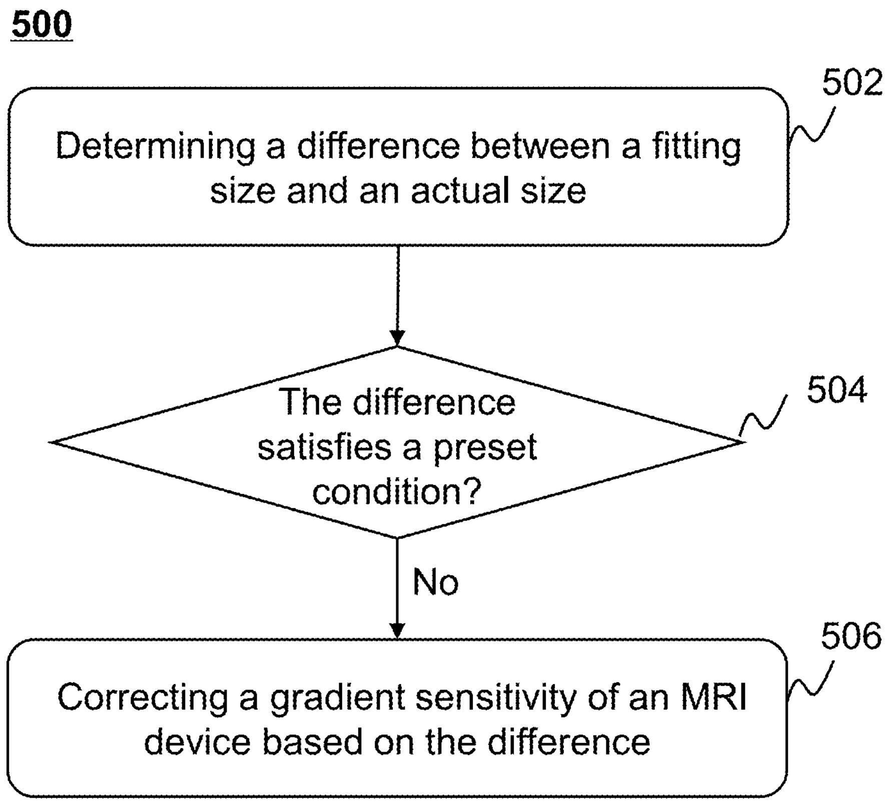
FIG. 5 is a flowchart illustrating an exemplary process for gradient sensitivity correction according to some embodiments of the present disclosure.

FIG. 5 is a flowchart illustrating an exemplary process 500 for correcting a gradient sensitivity according to some embodiments of the present disclosure. In some embodiments, the process 500 may be performed by the MRI system 100. For example, the process 500 may be stored in a storage device (e.g., the storage device 150) in the form of a set of instructions (e.g., application programs). In some embodiments, the processing device 140 (e.g., the one or more modules shown in FIG. 3) may execute the set of instructions and accordingly instruct one or more components of the MRI system 100 to perform the process 500. In some embodiments, the operation 406 in FIG. 4 may be implemented by performing the process 500.

In 502, the processing device 140 (e.g., the correction module 330) may determine a difference between a fitting size and an actual size.

The difference may characterize differences between the fitting size and the actual size.

In some embodiments, the processing device 140 may determine the difference between the fitting size and the actual size based on a difference value between the fitting size and the actual size. For example, the processing device 140 may determine a first difference value between the fitting size of the phantom on an X-axis and the actual size of the phantom on the X-axis, a second difference value between the fitting size of the phantom on a Y-axis and the actual size of the phantom on the Y-axis, and/or a third difference value between the fitting size of the phantom on a Z-axis and the actual size of the phantom on the Z-axis, respectively. The processing device 140 may further determine the difference between the fitting size and the actual size based on the first difference value, the second difference value, and the third difference value. For example, a sum of the first difference value, the second difference value, and the third difference value may be designated as the difference between the fitting size and the actual size. The larger the sum of the first difference value, the second difference value, and the third difference value, the greater the difference between the fitting size and the actual size. The smaller the sum of the first difference value, the second difference value, and the third difference value, the smaller the difference between the fitting size and the actual size.

In some embodiments, the processing device 140 may determine the difference between the fitting size and the actual size based on a ratio of the fitting size to the actual size. For example, the processing device 140 may determine a first ratio of the fitting size of the phantom on the X-axis to the actual size of the phantom on the X-axis, a second ratio of the fitting size of the phantom on the Y-axis to the actual size of the phantom on the Y-axis, and/or a third ratio of the fitting size of the phantom on the Z-axis to the actual size of the phantom on the Z-axis, respectively. The processing device 140 may further determine the difference between the fitting size and the actual size based on the first ratio, the second ratio, and the third ratio. For example, an average value of the first ratio, the second ratio, and the third ratio may be designated as the difference between the fitting size and the actual size. The closer the average value is to 1, the smaller the difference between the fitting size and the actual size. The farther the average value is away from 1, the greater the difference between the fitting size and the actual size.

In 504, the processing device 140 (e.g., the correction module 330) may determine whether the difference satisfies a preset condition.

In some embodiments, if the difference satisfies the preset condition, it means that the gradient sensitivity of the MRI device has been adjusted to an acceptable range. In other words, if the difference satisfies the preset condition, it means that the gradient sensitivity of the MRI device does not need to be adjusted.

In some embodiments, the preset condition may include a threshold corresponding to the difference. For example, if the difference is the difference value (e.g., the sum of the first difference value, the second difference value, and the third difference value) between the fitting size and the actual size, the preset condition may be that the difference value is less than a preset difference threshold or within a preset difference range, such as 0.1 millimeters (mm), 0.2 mm, 0.5 mm, 1 mm, 2 mm, 5 mm, etc. As another example, if the difference is the ratio (e.g., the average value of the first ratio, the second ratio, and the third ratio) of the fitting size to the actual size, the preset condition may be that the ratio is less than a preset ratio threshold or within a preset ratio range, such as a ratio range of 0.95 to 1.05, a ratio range of 0.9 to 1.1, a ratio range of 0.85 to 1.15, a ratio range of 0.8 to 1.2, etc.

When the difference value does not satisfy the preset condition, the processing device 140 may perform operation 506. In some embodiments, the operation 504 may be omitted, and the processing device 140 may directly perform the operation 506.

In 506, the processing device 140 (e.g., the correction module 330) may correct the gradient sensitivity of the MRI device.

In some embodiments, the processing device 140 may correct the gradient sensitivity of the MRI device based on the difference. For example, according to physical principles (e.g., features of a gradient magnetic field of the MRI system) of MR, the processing device 140 may determine a correction value of the gradient sensitivity based on the difference. Merely by way of example, the processing device 140 may obtain a relationship (e.g., a linear relationship)

between gradient sensitivities and differences in advance, and then determine the correction value of the gradient sensitivity based on the difference. Further, the processing device 140 may correct the gradient sensitivity of the MRI device based on the correction value. Merely by way of example, if the difference is the difference value between the fitting size and the actual size, the processing device 140 may determine the correction value of the gradient sensitivity based on the difference, and designate a sum of the correction value and the gradient sensitivity as a corrected gradient sensitivity. If the difference is the ratio of the fitting size to the actual size, the processing device 140 may determine the correction value of the gradient sensitivity based on the ratio, and designate a product of the correction value and the gradient sensitivity as the corrected gradient sensitivity.

In some embodiments, the processing device 140 may adjust a gradient sensitivity factor of the MRI device based on the difference between the fitting size and the actual size, so that the difference satisfies the preset condition. For example, if the difference between the fitting size and the actual size is reduced after the gradient sensitivity factor of the MRI device is adjusted, the gradient sensitivity factor of the MRI device may continue to be adjusted based on current adjustment. As another example, if the difference between the fitting size and the actual size increases after the gradient sensitivity factor of the MRI device is adjusted, the gradient sensitivity factor of the MRI device may be adjusted in an opposite direction to the current adjustment. Merely by way of example only, if the difference (e.g., the sum of the first difference value, the second difference value, and the third difference value) between the fitting size and the actual size is 0.8, and after the gradient sensitivity factor of the MRI device is adjusted, the difference between the fitting size and the actual size is 0.5, the gradient sensitivity factor of the MRI device may continue to be adjusted in the current adjustment to correct the gradient sensitivity of the MRI device until the difference satisfies the preset condition. As another example, if the difference between the fitting size and the actual size is 0.8, and after the gradient sensitivity factor of the MRI device is adjusted, the difference between the fitting size and the actual size is 0.9, the gradient sensitivity factor of the MRI device may be adjusted in the opposite direction to the current adjustment by adjusting the current adjustment, so as to correct the gradient sensitivity of the MRI device until the difference satisfies the preset condition.

According to some embodiments of the present disclosure, whether the difference between the fitting size and the actual size satisfies the preset condition can be determined, and when the difference does not satisfy the preset condition, the gradient sensitivity of the MRI device can be corrected. The gradient sensitivity factor of the MRI device can be accurately adjusted based on the difference, thereby improving the accuracy and efficiency of the gradient sensitivity correction of the MRI device.

It should be noted that the above description of the process 500 is merely provided for purposes of illustration, and is not intended to limit the scope of the present disclosure. For those skills in the art, various variations and modifications can be made under the guidance of the present disclosure. However, such variations and modifications do not depart from the scope of the present disclosure. In some embodiments, the process 500 may be completed by one or more additional operations not described and/or by omitting one or more operations discussed above.

Figure 6:
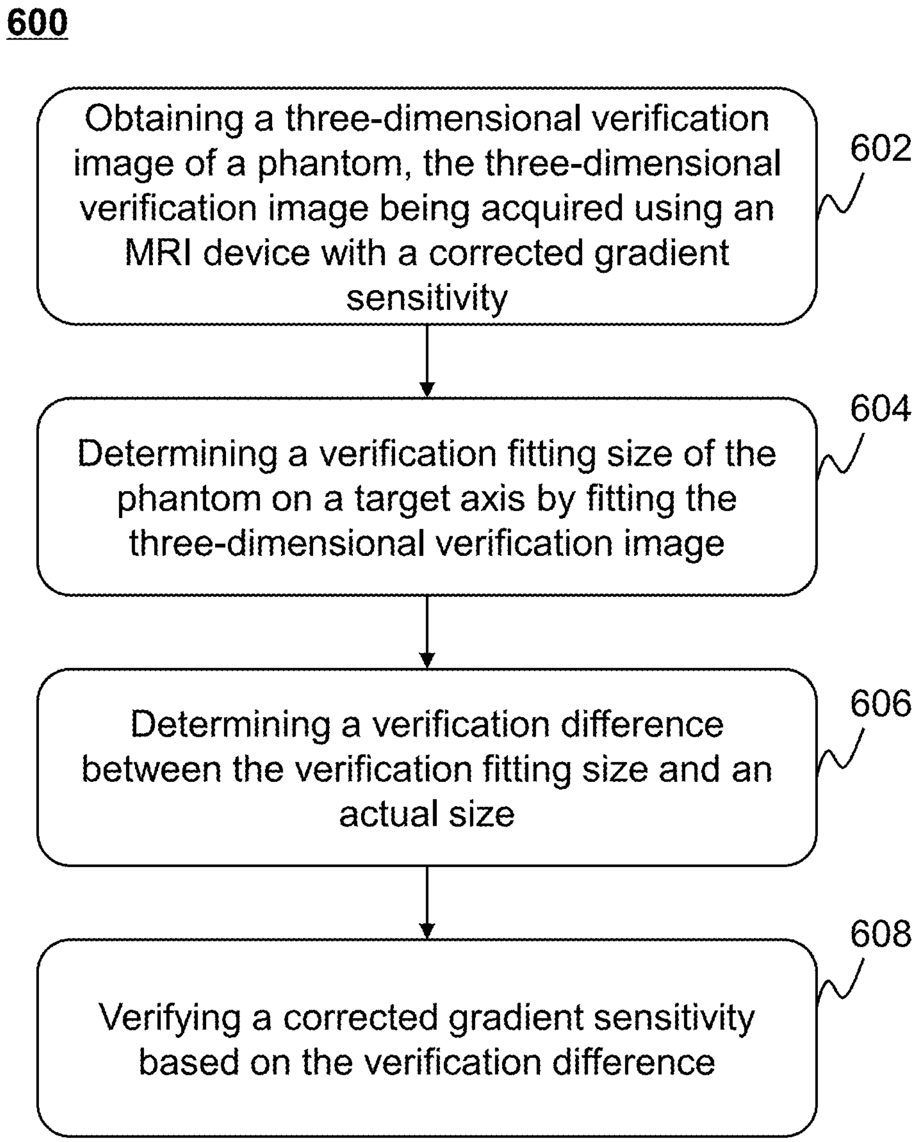
FIG. 6 is a flowchart illustrating an exemplary process for verifying a gradient sensitivity according to some embodiments of the present disclosure.

FIG. 6 is a flowchart illustrating an exemplary process 600 for verifying a gradient sensitivity according to some embodiments of the present disclosure. In some embodiments, the process 600 may be performed by the MRI system 100. For example, the process 600 may be stored in a storage device (e.g., the storage device 150) in the form of a set of instructions (e.g., application programs). In some embodiments, the processing device 140 (e.g., the one or more modules shown in FIG. 3) may execute the set of instructions and accordingly instruct one or more components of the MRI system 100 to perform the process 600. In some embodiments, the operation 406 in FIG. 4 may be implemented by performing the process 600.

In 602, the processing device 140 (e.g., the obtaining module 310) may obtain a three-dimensional verification image of a phantom.

The three-dimensional verification image may be acquired using an MRI device with a corrected gradient sensitivity. In some embodiments, the processing device 140 may correct the gradient sensitivity of the MRI device through the process 400 or the process 500, and acquire the three-dimensional verification image of the phantom using the MRI device with the corrected gradient sensitivity. An obtaining manner of the three-dimensional verification image may be similar to an obtaining manner of the three-dimensional image described in the operation 402.

In 604, the processing device 140 (e.g., the determination module 320) may determine a verification fitting size of the phantom on a target axis by fitting the three-dimensional verification image.

The verification fitting size refers to a size of the phantom on the target axis determined based on a fitted three-dimensional verification image or a fitted three-dimensional model. A determination manner of the verification fitting size may be similar to a determination manner of the fitting size described in the operation 404.

In 606, the processing device 140 (e.g., the calibration module 330) may determine a verification difference between the verification fitting size and an actual size.

In some embodiments, the processing device 140 may obtain the actual size of the phantom on the target axis based on a shape of the phantom. Alternatively, the processing device 140 may obtain the actual size of the phantom on the target axis based on a correction process (e.g., the process 400) of the gradient sensitivity.

The verification difference may represent a difference between the verification fitting size and the actual size. A determination manner of the verification difference may be similar to a determination manner of the difference described in the operation 502.

In 608, the processing device 140 (e.g., the correction module 330) may verify the corrected gradient sensitivity based on the verification difference.

A determination manner of whether the verification difference satisfies a preset condition may be similar to a determination manner of whether the difference satisfies the preset condition described in the operation 504.

When the verification difference satisfies the preset condition, the processing device 140 may determine that gradient sensitivity correction is completed. That is, MR imaging on a subject may be performed using the MRI device with the corrected gradient sensitivity.

When the verification difference does not satisfy the preset condition, the processing device 140 may determine that the gradient sensitivity of the MRI device needs to continue to be corrected until the corrected gradient sensitivity is verified (i.e., the corrected gradient sensitivity is verified through the process 600).

According to some embodiments of the present disclosure, the corrected gradient sensitivity of the MRI device can be verified based on the three-dimensional verification image acquired by the MRI device with the corrected gradient sensitivity, thereby ensuring the accuracy of gradient sensitivity correction.

It should be noted that the above description of the process 600 is merely provided for purposes of illustration, and is not intended to limit the scope of the present disclosure. For those skills in the art, various variations and modifications can be made under the guidance of the present disclosure. However, such variations and modifications do not depart from the scope of the present disclosure. In some embodiments, the process 600 may be completed by one or more additional operations not described and/or by omitting one or more operations discussed above.

Figure 7:
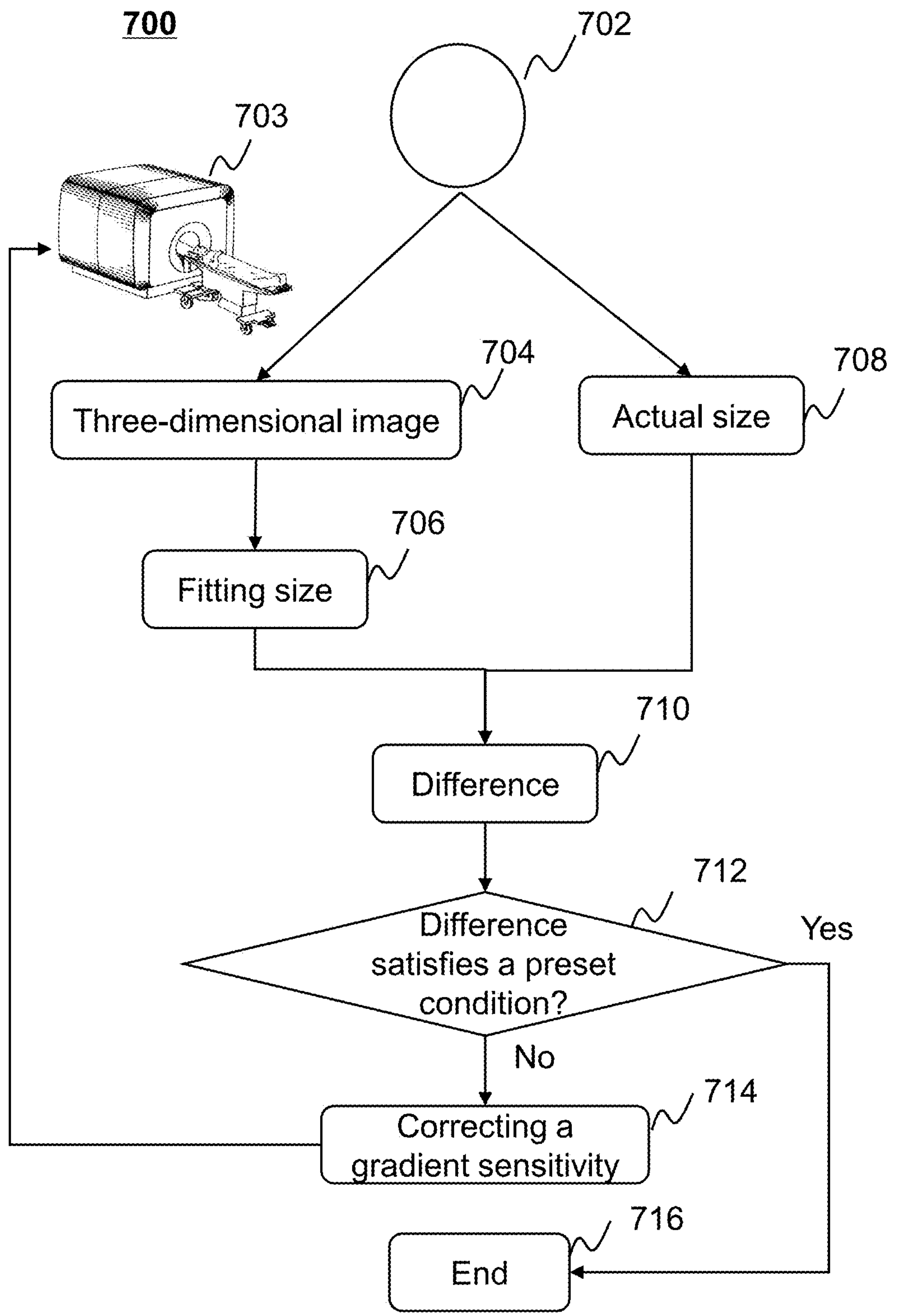
FIG. 7 is a schematic diagram illustrating an exemplary process for gradient sensitivity correction according to some embodiments of the present disclosure.

FIG. 7 is a schematic diagram illustrating an exemplary process 700 for correcting a gradient sensitivity according to some embodiments of the present disclosure.

As illustrated in FIG. 7, a three-dimensional image 704 of a spherical phantom 702 may be acquired using an MRI device. A fitting size 706 of the spherical phantom 702 on a target axis may be determined by fitting the three-dimensional image 704. Further, an actual size 708 of the spherical phantom 702 on the target axis may be obtained. A difference 710 between the fitting size 706 and the actual size 708 may be determined based on the fitting size 706 and the actual size 708. Further, the process 700 may proceed to operation 712 to determine whether the difference 710 satisfies a preset condition. If the difference 710 satisfies the preset condition, the process 700 may proceed to operation 716 to end the process 700. If the difference 710 does not satisfy the preset condition, the process 700 may proceed to operation 714 to correct the gradient sensitivity of the MRI device 703.

After the MRI device 703 has a corrected gradient sensitivity, the process 700 may be performed again to verify the corrected gradient sensitivity. For instance, the MRI device 703 with the corrected gradient sensitivity may acquire the three-dimensional image 704 (referred to as a three-dimensional verification image) of the spherical phantom 702 again. The fitting size 706 (referred to as a verification fitting size) of the spherical phantom 702 on the target axis may be determined by fitting the three-dimensional verification image again. The difference 710 (referred to as a verification difference) between the verification fitting size and the actual size 708 may be determined based on the verification fitting size and the actual size 708. Further, the process 700 may proceed to operation 712 to determine whether the verification difference satisfies the preset condition. If the verification difference satisfies the preset condition, the process 700 may proceed to operation 716 to end the process 700. That is, it can be understood that the corrected gradient sensitivity is verified. If the verification difference does not satisfy the preset condition, the process 700 may proceed to operation 714 to continue to correct the gradient sensitivity of the MRI device 703 until the corrected gradient sensitivity is verified.

In some embodiments of the present disclosure, (1) the gradient sensitivity of the MRI device can be corrected based on the fitting size and the actual size, thereby improving the accuracy of gradient sensitivity correction. (2) The gradient sensitivity can be corrected through the spherical phantom. Due to the physical properties of the sphere, the spherical phantom can be placed at any position of the magnet imaging region of the MRI system. That is, the center of the spherical phantom does not need to coincide with the central position of the magnet imaging region, which reduces the requirements for the positioning of the phantom during the gradient sensitivity correction, thereby improving the accuracy and efficiency of the gradient sensitivity correction. (3) Since the requirements for the positioning of the phantom during the gradient sensitivity correction are reduced, the method for gradient sensitivity correction according to some embodiments of the present disclosure can be applied to any MRI system, especially an MRI system (e.g., the cantilever MRI system, the animal MRI system, the infant MRI systems, etc.) with a small scanning chamber and difficulty in positioning the phantom. (4) The corrected gradient sensitivity of the MRI device can be verified based on the three-dimensional verification image acquired by the MRI device with the corrected gradient sensitivity, thereby ensuring the accuracy of gradient sensitivity correction.

Some embodiments of the present disclosure further provide an MRI device. The MRI device may comprise at least one storage medium configured to store computer instructions, and at least one processor configured to execute the computer instructions to implement the method for gradient sensitivity correction described in the present disclosure. More technical details may be found in the relevant descriptions in FIGS. 1-8, which are not repeated herein.

Some embodiments of the present disclosure further provide a non-transitory computer-readable storage medium comprising computer instructions. When a computer reads the computer instructions, the computer may be directed to implement the method for gradient sensitivity correction described in the present disclosure. More technical details may be found in the relevant descriptions in FIGS. 1-8, which are not repeated herein.

It should be noted that user information (including but not limited to user device information, user personal information, etc.) and data (including but not limited to data used for analysis, stored data, displayed data, etc.) included in the present disclosure are information and data authorized by users or fully authorized by all parties.

Having thus described the basic concepts, it may be rather apparent to those skilled in the art after reading this detailed disclosure that the foregoing detailed disclosure is intended to be presented by way of example only and is not limiting. Although not explicitly stated here, those skilled in the art may make various modifications, improvements, and amendments to the present disclosure. These alterations, improvements, and amendments are intended to be suggested by this disclosure and are within the spirit and scope of the exemplary embodiments of the present disclosure.

Moreover, certain terminology has been used to describe embodiments of the present disclosure. For example, the terms “one embodiment,” “an embodiment,” and/or “some embodiments” mean that a particular feature, structure, or feature described in connection with the embodiment is included in at least one embodiment of the present disclosure. Therefore, it is emphasized and should be appreciated that two or more references to “an embodiment” or “one embodiment” or “an alternative embodiment” in various portions of the present disclosure are not necessarily all referring to the same embodiment. In addition, some features, structures, or characteristics of one or more embodiments in the present disclosure may be properly combined.

Furthermore, the recited order of processing elements or sequences, or the use of numbers, letters, or other designations, therefore, is not intended to limit the claimed processes and methods to any order except as may be specified in the claims. Although the above disclosure discusses some embodiments of the invention currently considered useful by various examples, it should be understood that such details are for illustrative purposes only, and the additional claims are not limited to the disclosed embodiments. Instead, the claims are intended to cover all combinations of corrections and equivalents consistent with the substance and scope of the embodiments of the invention. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure does not mean that object of the present disclosure requires more features than the features mentioned in the claims. Rather, claimed subject matter may lie in less than all features of a single foregoing disclosed embodiment.

In some embodiments, the numbers expressing quantities or properties used to describe and claim certain embodiments of the present disclosure are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the present disclosure are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes. History application documents that are inconsistent or conflictive with the contents of the present disclosure are excluded, as well as documents (currently or subsequently appended to the present specification) limiting the broadest scope of the claims of the present disclosure. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the present disclosure disclosed herein are illustrative of the principles of the embodiments of the present disclosure. Other modifications that may be employed may be within the scope of the present disclosure. Thus, by way of example, but not of limitation, alternative configurations of the embodiments of the present disclosure may be utilized in accordance with the teachings herein. Accordingly, embodiments of the present disclosure are not limited to that precisely as shown and described.

What is claimed is:

1. A method for gradient sensitivity correction, implemented by at least one processor, comprising:

obtaining a three-dimensional image of a phantom, the three-dimensional image being acquired using a magnetic resonance imaging (MRI) device, and the phantom having a known actual size on a target axis;

determining a fitting size of the phantom on the target axis by fitting the three-dimensional image; and correcting, based on the fitting size and the actual size, a gradient sensitivity of the MRI device, wherein the gradient sensitivity represents a scale relationship between a subject to be scanned by the MRI device and an image acquired by the MRI device in an MR scan of the subject.

2. A system for gradient sensitivity correction, comprising:

a storage device configured to store computer instructions; and a processor connected with the storage device and configured to, when the computer instructions are executed, direct the system to:

obtain a three-dimensional image of a phantom, the three-dimensional image being acquired using a magnetic resonance imaging (MRI) device, and the phantom having a known actual size on a target axis;

determine a fitting size of the phantom on the target axis by fitting the three-dimensional image; and correct, based on the fitting size and the actual size, a gradient sensitivity of the MRI device, wherein the gradient sensitivity represents a scale relationship between a subject to be scanned by the MRI device and an image acquired by the MRI device in an MR scan of the subject.

3. A non-transitory computer-readable storage medium storing computer instructions that, when a computer reads the computer instructions, direct the computer to execute a method for gradient sensitivity correction, including:

obtaining a three-dimensional image of a phantom, the three-dimensional image being acquired using a magnetic resonance imaging (MRI) device, and the phantom having a known actual size on a target axis;

determining a fitting size of the phantom on the target axis by fitting the three-dimensional image; and correcting, based on the fitting size and the actual size, a gradient sensitivity of the MRI device.

4. The method of claim 1, wherein the phantom is a spherical phantom.

5. The method of claim 1, wherein the phantom is a non-spherical phantom, and the non-spherical phantom is positioned based on the target axis.

6. The method of claim 1, wherein the determining a fitting size of the phantom on the target axis by fitting the three-dimensional image includes:

determining, based on the three-dimensional image, at least one central section; and determining, based on the at least one central section, the fitting size of the phantom on the target axis.

7. The method of claim 1, wherein the correcting, based on the fitting size and the actual size, a gradient sensitivity of the MRI device includes:

determining a difference between the fitting size and the actual size;

determining whether the difference satisfies a preset condition; and in response to determining that the difference does not satisfy the preset condition, correcting the gradient sensitivity of the MRI device to obtain a corrected gradient sensitivity.

8. The method of claim 1, wherein the MRI device includes a cantilever bed, and the phantom is placed on the cantilever bed.

9. The method of claim 1, wherein the target axis includes three coordinate axes corresponding to a coordinate system, the coordinate system is established with a central position of a magnet imaging region of the MRI device as an origin, and with three spatially orthogonal axes as three axial directions, respectively.

10. The system of claim 2, wherein the phantom is a spherical phantom.

11. The system of claim 2, wherein the phantom is a non-spherical phantom, and the non-spherical phantom is positioned based on the target axis.

12. The system of claim 2, wherein the determining a fitting size of the phantom on the target axis by fitting the three-dimensional image includes:

determining, based on the three-dimensional image, at least one central section; and determining, based on the at least one central section, the fitting size of the phantom on the target axis.

13. The system of claim 2, wherein the correcting, based on the fitting size and the actual size, a gradient sensitivity of the MRI device includes:

determining a difference between the fitting size and the actual size;

determining whether the difference satisfies a preset condition; and in response to determining that the difference does not satisfy the preset condition, correcting the gradient sensitivity of the MRI device to obtain a corrected gradient sensitivity.

14. The system of claim 2, wherein the MRI device includes a cantilever bed, and the phantom is placed on the cantilever bed.

15. The system of claim 2, wherein the target axis includes three coordinate axes corresponding to a coordinate system, the coordinate system is established with a central position of a magnet imaging region of the MRI device as an origin, and with three spatially orthogonal axes as three axial directions, respectively.

16. The non-transitory computer-readable storage medium of claim 3, wherein the determining a fitting size of the phantom on the target axis by fitting the three-dimensional image includes:

determining, based on the three-dimensional image, at least one central section; and determining, based on the at least one central section, the fitting size of the phantom on the target axis.

17. The method of claim 7, further comprising:

verifying the corrected gradient sensitivity.

18. The system of claim 13, wherein the system is further directed for:

verifying the corrected gradient sensitivity.

19. The method of claim 17, wherein the verifying the corrected gradient sensitivity includes:

obtaining a three-dimensional verification image of the phantom, the three-dimensional verification image being acquired using the MRI device with the corrected gradient sensitivity;

determining a verification fitting size of the phantom on the target axis by fitting the three-dimensional verification image;

determining a verification difference between the verification fitting size and the actual size; and verifying, based on the verification difference, the corrected gradient sensitivity.

20. The system of claim 18, wherein the verifying the corrected gradient sensitivity includes:

obtaining a three-dimensional verification image of the phantom, the three-dimensional verification image being acquired using the MRI device with the corrected gradient sensitivity;

determining a verification fitting size of the phantom on the target axis by fitting the three-dimensional verification image;

determining a verification difference between the verification fitting size and the actual size; and verifying, based on the verification difference, the corrected gradient sensitivity.

* * * * *